United States Patent

Hwang et al.

[11] Patent Number: 5,846,476
[45] Date of Patent: Dec. 8, 1998

[54] OPTICAL CURING PROCESS FOR INTERGRATED CIRCUIT PACKAGE ASSEMBLY

[75] Inventors: Ming Hwang, Richardson; Leslie E. Stark; Gail Heinen, both of Dallas, all of Tex.; Leo Rimpillo, Baguio City, Philippines

[73] Assignee: Texas Instruments Incorporated, Dallas, Tex.

[21] Appl. No.: 848,942

[22] Filed: May 2, 1997

Related U.S. Application Data

[60] Continuation of Ser. No. 477,961, Jun. 7, 1995, abandoned, which is a division of Ser. No. 255,200, Jun. 7, 1994, abandoned.

[51] Int. Cl.$^6$ ............................................. B29C 35/08
[52] U.S. Cl. .................... 264/493; 264/494; 264/272.11; 264/272.17
[58] Field of Search ............................ 264/236, 272.11, 264/272.17, 476, 478, 488, 492, 494, 402, 405; 437/207, 219

[56] References Cited

U.S. PATENT DOCUMENTS

| | | | |
|---|---|---|---|
| 2,388,042 | 10/1945 | Daily | 264/493 |
| 2,638,633 | 5/1953 | Root | 264/493 |
| 2,941,934 | 6/1960 | Anspon et al. | 264/488 |
| 4,167,669 | 9/1979 | Panico | 250/432 R |
| 4,460,537 | 7/1984 | Heinle | 264/272.17 |
| 4,822,536 | 4/1989 | Voinis et al. | 264/272.17 |
| 4,883,424 | 11/1989 | Sakai et al. | 432/77 |
| 4,908,078 | 3/1990 | Muramatsu et al. | 148/439 |
| 4,913,930 | 4/1990 | Getson | 264/272.17 |
| 4,919,857 | 4/1990 | Hojyo | 264/272.17 |
| 4,996,170 | 2/1991 | Baird | 264/272.17 |
| 5,110,515 | 5/1992 | Nakamura et al. | 264/272.17 |

FOREIGN PATENT DOCUMENTS

| | | |
|---|---|---|
| 0215462 | 3/1987 | European Pat. Off. . |
| 330909 | 9/1989 | European Pat. Off. . |
| 3744764 | 6/1989 | Germany . |
| 4127009 | 2/1993 | Germany . |

OTHER PUBLICATIONS

Research, Inc. Brochure, Infrared Line Heater, Model 5193, pp. 1–4, 1990.
Chemical Engineer's Handbook, John H. Perry, Fourth Edition, pp. 20–66.
Use of Diffused Infrared Lamp "Heat" For Chip Join—C4 Reflow, IBM Technical Disclosure Bulletin, vol. 36, No. 10, Oct., 1993.
Patent Abstracts of Japan, vol. 8, No. 128(M–302), Jun. 14, 1984.
Patent Abstracts of Japan, vol. 5, No. 51 (E–051), Apr. 10, 1981.
Patent Abstracts of Japan, vol. 13, No. 240(E–767), Jun. 6, 1989.
WPI, Derwent Pub. Inc, AN 79–55356B.

*Primary Examiner*—Richard Crispino
*Attorney, Agent, or Firm*—W. Daniel Swayze, Jr.; Wade James Brady, III; Richard L. Donaldson

[57] ABSTRACT

In semiconductor device assembly operations, the use of an optical heat source 28, such as a tungsten halogen lamp module, is to replace ovens and heater blocks for curing die-attach material and molding compound with reduction in cycle time, cost, footprint, and contamination.

1 Claim, 4 Drawing Sheets

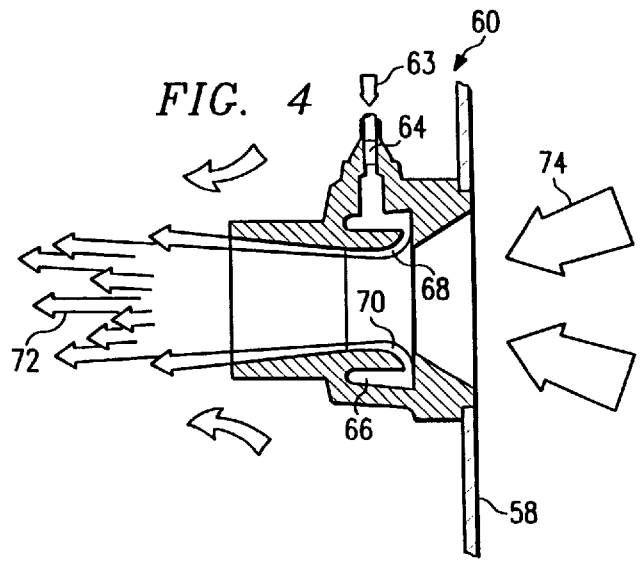
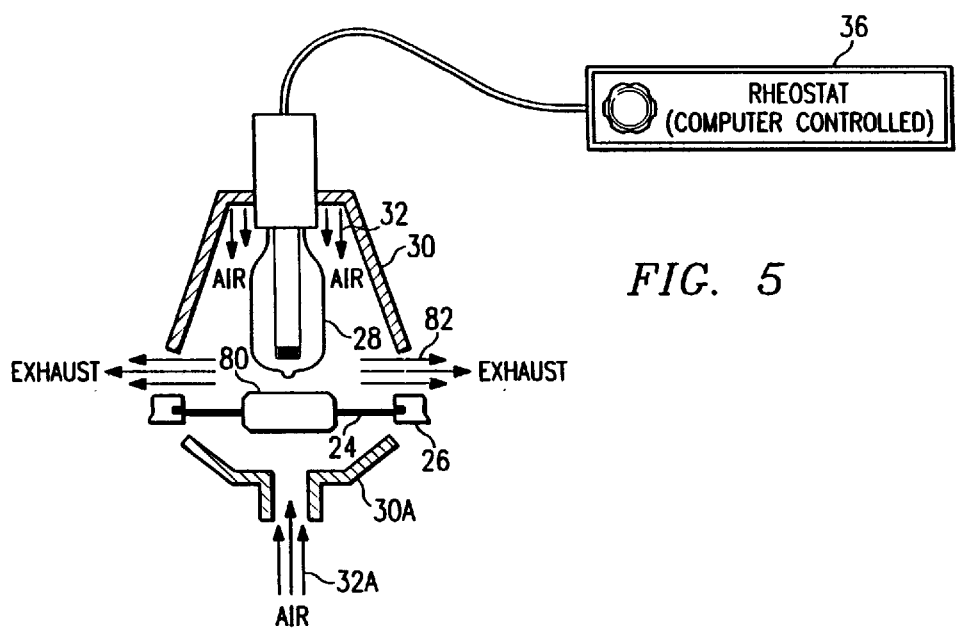

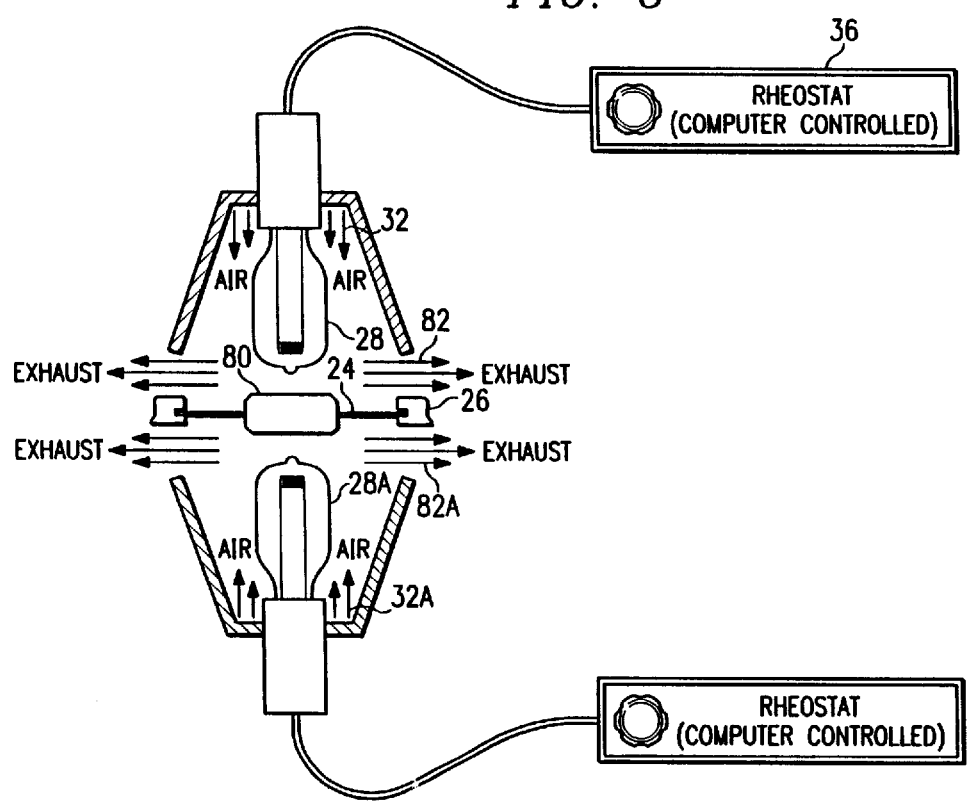

OPTICAL CURING PROCESS FOR INTERGRATED CIRCUIT PACKAGE ASSEMBLY

CROSS REFERENCE TO RELATED APPLICATION

This application is a Continuation of application Ser. No. 08/477,961 filed on Jun. 7, 1995, now abandoned, which is a Divisional application of Ser. No. 08/255,200 filed on Jun. 7, 1994, now abandoned.

FIELD OF THE INVENTION

The invention relates generally to the field of semiconductor manufacturing, more particularly to "back end" assembly, and in particular to chip (die) attach and encapsulation.

BACKGROUND OF THE INVENTION

The manufacturing of packaged integrated semiconductor devices occurs generally in two stages known as "front end" processing and "back end" processing. "Front end" processing deals with formation of various devices such as transistors, resistors, and capacitors on a semiconductor wafer. "Back end" processing deals with assembly and test. After formation of the various devices on the semiconductor wafer, the wafer is sliced into semiconductor dies, the dies are assembled into packages, and the packaged dies are tested. Although various packaging techniques exist, the two main techniques are ceramic packaging and plastic packaging. These techniques are described throughout *Microelectronics Packaging Handbook* by Rao R. Tummala and Eugene J. Rymaszewski, copyright 1989, and in particular in chapters 6–8 and 10.

While different ceramic packages exist, one common ceramic package is the lid sealed package. A semiconductor chip is attached to a ceramic base by a chip bond material. Wire bonds then connect the semiconductor chip to metal lines on the ceramic base. Leads are then brazed to the ceramic base and connected to the metal lines to provide external connection. Finally, a lid is attached by a seal to cover the semiconductor die and close the ceramic package. Plastic packaged devices are usually formed by attaching the semiconductor chip to a lead frame with a chip die attach material. The lead frame is typically metallic and includes a die support pad (that the semiconductor die is attached to) and lead fingers. Wire bonding then occurs where lead frame fingers are connected to bonding pads on the semiconductor die. Bond wires typically connect the lead fingers to the bonding pads. The adhesive holds the semiconductor die in place during the wire bonding process. Thereafter, encapsulation occurs with the lead frame and die being encapsulated in a plastic mold compound. The mold compound is cured and the lead frame trimmed and formed.

From above, it is seen that both ceramic packaged devices and plastic packaged devices require a chip bonding material to secure the chip to the underlying structure. Three broad categories of chip die attach materials currently exist: solders; organic adhesives; and, glass silver-fill. Exemplary of solders are Au—Si, Au—Sn, Au—Ge, Pb—Ag—In, and Pb—Sn metallic compositions. Ceramic packages most often use solder. Exemplary of organic adhesives are epoxies, polyimides (most frequently filled with silver) and thermoplastics such as acrylics, polyester or polyamides filled with metal. Table 8–5 on pages 556 and 557 of *Microelectronics Packaging Handbook* contains a listing of epoxy and polyimide chip polymer bonding adhesives. Plastic packaging may use either solder or organic bonding. Silver-filled specialty glass materials are exemplary of glass materials and are discussed in "A Critical Review of VLSI Die-Attachment in High Reliability Applications" by Shukla and Mancinger appearing in *Solid State Technology*, July 1985 page 67 et seq. Regardless of package type, the chip bonding material is heated to firmly secure the chip.

Page 554 of *Microelectronics Packaging Handbook* describes chip (die) attach in plastic packaging. In solder bonding, lead frames are fed from magazine holders along a track to a heater block. A small square of material (such as 6% Si, 94 Au) is cut from a feed ribbon and transferred to the chip support pad of the lead frame. The chip is placed onto the heated chip support pad by a collet. The chip and eutectic are scrubbed together by the collet, forming a hard alloy bond. The heater temperature is about 420° C. and the time for eutectic bonding is about 6–8 seconds. The heat transfer mechanism is by conduction. In polymer bonding, the metal filled epoxy or polyimide paste is typically applied to the lead frame die support pad by a print head. The die is pressed into the paste after printing. The paste is then cured to strongly adhere the lead frame to the semiconductor die. Epoxies and polyimides are organic thermosetting polymers that must be cured at elevated temperatures to complete the die bond. For many years, the industry standard epoxy cure process has consisted of placing the lead frames (with mounted dies) into heated ovens where it usually takes a minimum of about one hour for the resin to cure. Typical schedules are one hour at 150° C. for epoxies, and 30 minutes at 150° C., followed by 30 minutes at 275° C. for polyimides. In the oven cure process, heat transfer is by convection and the semiconductor die, epoxy resin, and lead frame are all uniformly heated to the temperature of the oven.

A relatively new epoxy snap cure process substantially speeds up polymer die attach curing from about an hour to about a minute. This snap cure process is depicted generally in prior art FIG. 1. In FIG. 1, a semiconductor die 4 is attached by an epoxy resin 6 to a metallic lead frame 8. Epoxy resin 6 is on the order of about 0.001 inches thick. A lead frame track rail 10 guides and holds lead frame 8 in place over a heater block 12. Heater block 12 includes a filament (unillustrated) that heats block 12 to a desired temperature, approximately 200° C., necessary to cure epoxy 6. Heat is transferred from heater block 12, to lead frame 8, to film 6 and to die 4 by conduction. Die 4, film 6 and lead frame 8 are all heated to the temperature of block 12. During heating, dry air 16 flows over the die 4, across the surface of lead frame 8, through lead finger cutouts (unillustrated) in lead frame 8, around heater block 12, and out through an exhaust 18. The air flow aids in lowering harmful effects of the gasses released by the die attach during die attach cure. Out gassing can result in contamination on bond pads of die 4 and lead to wire bonding and reliability problems. A large squirrel cage electromechanical AC motor provides exhaust vacuum 18. Hitachi Tokyo Electronics Co., Ltd. sells this rapid cure process in a piece of semiconductor manufacturing equipment called the "AC-050 In Line Epoxy Curing System". The AC-050 contains about 4 or 5 heater block platforms, each heater block 12 being about 10 inches long. Other commercially available snap cure apparatus employing heater block technology are manufactured by Syncrite and Moia.

While the AC-050 style apparatus illustrated in prior art FIG. 1 substantially reduces the amount of time needed to cure epoxy film 6 from about an hour to about a minute, the apparatus has several disadvantages. The AC-050 is a large unit, about 3 feet wide, 3 feet deep, and 4 feet high and thus occupies much valuable manufacturing floor space. The lead frame die attach pad can warp and be contaminated due to contact between the lead frame and heater block. Bond pads on the chip and the lead frame may be contaminated due to outgassing from the die attach material and high temperature of the lead frame. A new method of rapid die attach is needed.

*Microelectronics Packaging Handbook* page 555 et seq. provides extensive discussion about molding compounds used for plastic encapsulation and techniques of plastic encapsulation. In general the mold compounds are polymers of either the thermoset variety that cannot be remelted or the thermoplastic variety that can be remelted. Examples include epoxy novolac-based molding compounds (mainly used today), polyester, phenolic, and silicone. The industry standard plastic encapsulation technique is transfer molding. After the mold compound is applied to the chip and lead frame assembly to encapsulate the assembly, the mold compound must be cured. As in chip attach, the industry standard method of mold compound cure is to place the encapsulated chip and lead frame assembly into an oven. The encapsulated device is heated for several hours at temperatures around 175° C. to cure the mold compound. New methods of post mold cure are needed to substantially speed up post mold cure.

SUMMARY OF THE INVENTION

A rapid cure die attach cure method employs an optical heat source such as a tungsten halogen lamp module to heat the die attach material. An optical heat source may be used to cure the mold compound used in transfer molded semiconductor packages.

DESCRIPTION OF THE DRAWINGS

FIG. 4 is a drawing illustrating the air amplifier of FIG. 3.

FIG. 5 is a drawing conceptually illustrating an inventive optical rapid cure mold compound apparatus and method.

FIG. 6 is a drawing conceptually illustrating an alternative optical rapid cure mold compound apparatus and method.

DETAILED DESCRIPTION OF PREFERRED EMBODIMENT

Figure 2:
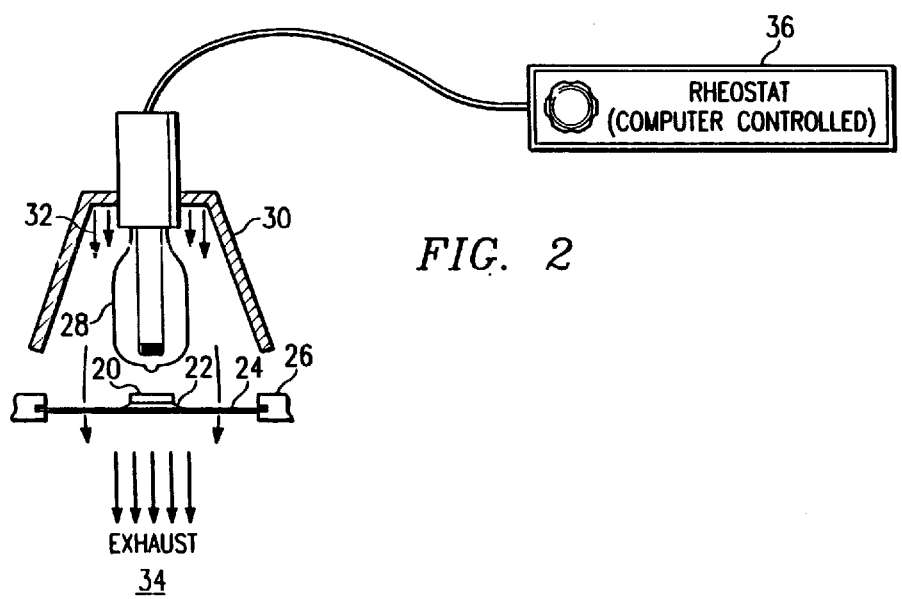
FIG. 2 is drawing conceptually illustrating an inventive optical rapid die attach cure apparatus and method.

FIG. 2 is a drawing conceptually illustrating an inventive optical rapid cure die attach apparatus and method. In FIG. 2, a semiconductor die 20 is attached by a die attach material 22 to a lead frame 24. Die attach material 22 is representative of die attach materials and includes solders, organic adhesives, and glass specialty materials. Examples of lead frame materials include copper, alloy 42, palladium/copper, and nickel copper. A lead frame track rail 26 guides and holds lead frame 24 in place underneath an optical heat source 28. Lead frame track rail 26 is adjustable to hold different sizes of lead frames. A typical lead frame 24 that holds one row of die may be about 1.25 inches wide. High density lead frames, such as MATRIX lead frames may hold several rows of dies of and are much wider. Optical heat source 28 generates the energy that is used to heat die attach material 22. Polymer bonding may be accomplished very quickly, such as for example, with about a 1 minute exposure to optical heat source 28 while inorganic bonding, such as silicon/gold eutectic bonding, may be accomplished rapidly also. Heat is transferred from die 20 to die attach 22 and to the die support pad of lead frame 24. The portion of lead frame 24 not covered by die attach 22 and die 20 substantially reflects light radiation from optical heat source 28. For organic die attach with copper based lead frames and normal die size, this is particularly advantageous as the rails and fingers of lead frame 24 remain much cooler than die 20 during die cure. As an example, a 1 minute exposure to optical heat source 28 may result in die 20 being heated to about 200° C. while lead frame 24 is heated to only about 125° C. As such, optical heat source 28 selectively heats die 20. Principle heat transfer occurs by radiation and the temperature response of the die attach is advantageously a smooth transient. Temperature profiles can be readily controlled during cure by varying the current through the lamp. In the prior art heater block method, however, heat transfer is through conduction which results in a step function like temperature response. Resident heat in the heater block precludes rapid cooling which is needed for thermoplastic die attach. Rapid optical heating allows rapid thermal response and can be used with thermoplastic die attach materials.

While more details regarding optical heat source 28 of FIG. 2 are provided later with reference to FIG. 3., it is believed that optical heat source 28 is preferably a lamp of the type that emits near infrared light. Exemplary lamp examples include incandescent halogen lamps of the tungsten type and xenon type. Infrared light wavelengths range from just under 0.8 microns to around about 2.8 microns. It is believed that silicon chip 20 has good absorption in the near infrared spectrum. The energy of the tungsten halogen light, for example, is absorbed more by silicon chip 20 than by lead frame 24 which has a higher incidence of reflection than chip 20. The silicon chip 20, with die attach 22, is heated by radiation to a higher temperature than lead frame 24 due to selective heating.

Figure 1:
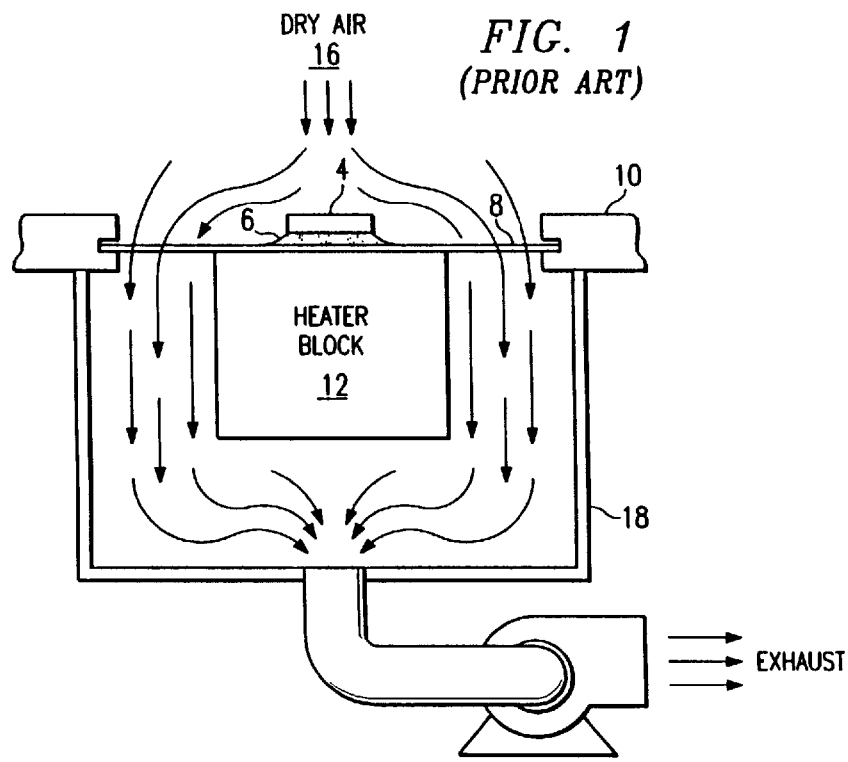
FIG. 1 is a prior art drawing illustrating the heater block snap cure polymer bond method.

Referring still to FIG. 2, a reflector 30 helps direct emissions from lamp 28 towards lead frame 24. Preferably the emissions are directed over the width of the lead frame so that uniform heating occurs. The light is spread over the lead frame area as opposed to being focused on the semiconductor chip. Dry air 32 flows over the die 20, through lead finger cutouts (unillustrated) in lead frame 24 and out exhaust outlet 34. Unlike FIG. 1's heater block 12, no obstruction exists underneath lead frame 24 of FIG. 2 to block air flow. Purge air 32 is able to flow over die 20 and through lead frame 24 more closely to the edge of die 20 substantially increasing the evacuation of harmful outgassing effects and epoxy fragments. The intensity (power) of lamp 28 may be controlled by a rheostat 36 or SCR which in turn may be computer controlled. This advantageously allows lamp power to be profiled or turned on and off with immediate energy response in contrast to the heater block of prior art FIG. 1 which is effectively unprofitable during snap cure because of its thermal mass. Instant lamp power adjustment aids in energy profiling that may be desirable in cases where some die bond materials need time to reach final cure temperature in order for volatiles to escape.

Figure 3:
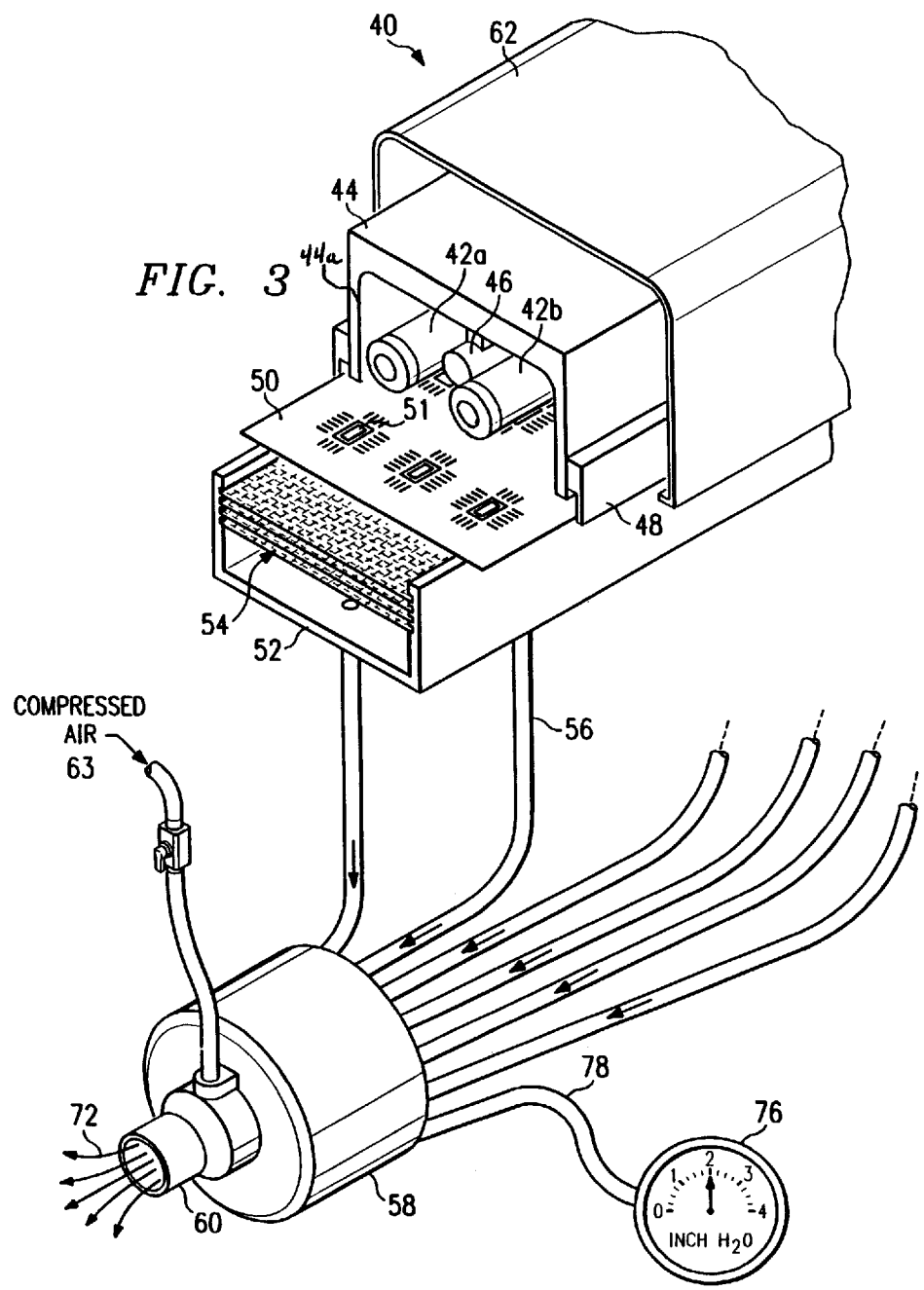
FIG. 3 is a partial isometric drawing illustrating a preferred embodiment optical rapid die attach cure apparatus.

Referring now to FIG. 3, a preferred embodiment of an optical rapid cure apparatus 40 is disclosed. Apparatus 40 contains an optical heat source 42 (illustrated as lamps 42a and 42b) attached to a reflector housing 44. A gas shower 46 is also attached to reflector housing 44. Lead frame track rails 48 hold and guide lead frame 50 below optical heat source 42. An exhaust manifold 52 having screen diffusers 54 is positioned below lead frame 50. Exhaust manifold 52 is connected by hoses 56 to an amplifier manifold 58 to which an air amplifier vacuum generator 60 is connected. A shroud 62 may cover reflector housing 44 for safety. A lead frame index mechanism (unillustrated) may be provided and controlled by die bonding equipment, or wire by bonding equipment, or by computer and process control equipment. Although optical rapid cure apparatus 40 may be configured as a stand alone piece of back end manufacturing equipment, a major advantage is the small size of the assembly. The reflector 44 and exhaust manifold 52 assembly is on the order of about 10.5 inches long, 3 inches wide, and 3 inches high. The small size allows the apparatus to be configured on a die bonder. It may be placed downstream on the die bonder post die application. The small size allows the apparatus to be configured on a wire bonder. It may be placed upstream of the bonder head. Thus, the apparatus may be used effectively with existing manufacturing space and use of controllers resident with die bond or wire bond equipment. Additionally, it may be used to link the die bond equipment and wire bond equipment.

In FIG. 3, optical heat source 42 is preferably a lamp of the type whose energy is reflected by the metal lead frame 50. A tungsten halogen lamp is exemplary. Such lamps are commercially available and made by General Electric, Osram-Sylvania, and Ushio. Off the shelf available wattages range from about 1000–2000 watts, 120 or 240 VAC, with 12 inch length and a diameter of about 0.4 inches. Custom bulbs are available in 10 inch length, 600–800 watts, 110 VAC, or other desired length configuration as required by the lead frame and equipment length. Bulb mounting plates at the ends of reflector 44 position the bulbs within the reflector. The mounted bulbs extend above lead frame 50. The height of the mounted bulbs above lead frame 50 may be adjusted with the effect controlled by light intensity. It is desirable to position the bulbs within the reflector housing 44 so that temperature across the width of the lead frame is uniform. The distance between bulbs 42 and lead frame 50 is about 0.78 inches. While optical heat source 42 as illustrated contains 2 lamps, single lamp sources are sufficient. The width of lead frame 50 may govern whether single or multiple lamps are better. Multiple lamps may be better suited for wider lead frames 50 while a single lamp may be suitable for the typical lead frame width of about 1.25 inches.

In FIG. 3, reflector housing 44 may consist of a metal block having a recess 44a formed therein for placement of lamp 42. Aluminum is a suitable metal for reflector housing 44 because of its reflectivity. Polishing recess 44a provides for better reflection of emissions from lamp 42 to semiconductor chips 51 attached to lead frame 50. Although not illustrated, the reflector housing may have slits in the top to aid cooling. Reflector housing 44 also holds gas shower 46. Gas shower 46 is a tube having apertures therein so that a gas may be dispersed over lead frame 50 during die attach cure. The tube may be metal, such as aluminum, and in the apparatus illustrated, is about 0.25 inches in diameter, about 8.5 inches long, and has apertures spaced about 0.10 inches apart. Shower 46 has a mounting bracket (unillustrated) and is screwed into reflector 44. Dry air is a suitable gas for dispersion as is nitrogen. Gas dispersion rate is optimized depending upon the amount of exhaust pressure used. In general, the less exhaust pressure used, the lower the necessary dispersion rate. Gas flow of 20 scfh with exhaust vacuum of 1.5" $H_2O$ works well. The gas shower may be centered as shown or may be placed at an angle to provide turbulence of the gases in the vicinity of the die surface and bonding lands of the lead frame.

Still referring to FIG. 3, lead frame track rails 48 hold lead frame 50. The illustrated lead frame 50 is of the MATRIX type, about 2.00 inches wide, with three semiconductor chips 51 disposed across the width of the lead frame. As mentioned above, an important advantage of optical cure apparatus 40 is the small size which allows for mounting directly onto a wire bonding machine, such as the commercially available ABACUS III wire bonder manufactured by Texas Instruments Incorporated. Placing optical cure apparatus 40 upstream of the bonder head allows for more automation in the assembly process. The lead frame is fed into the bonder transport and into optical cure apparatus 40. Rapid polymer curing occurs in about 1 minute to adhere semiconductor dies 51 to lead frame 50. The bonder transport carries lead frame 50 from apparatus 40 to the bonder head where wire bonding occurs.

Referring still to FIG. 3, exhaust manifold 52 resides underneath lead frame 50. By removing heater block 12 of FIG. 1, the exhaust below lead frame 50 of FIG. 3 is unobstructed and much better outgassing removal is achieved. Exhaust manifold 52 contains diffuser screens 54. Slots in exhaust manifold 52 hold the diffuser screens 54 in place. The screens have apertures therein. The screens 54 are preferably formed of a rigid material, such as stainless steel, to withstand temperature and an exhaust vacuum. The bottom of exhaust manifold 52 has apertures therein for exhaust removal. The apertures are about 0.25 inches diameter and are spaced equally across the length of manifold 52. Six apertures are used in the preferred embodiment. The apertures are connected by hoses 56 to amplifier manifold 58. The hoses are preferably of equal size and equal length so that the same amount of air flows through each. Hoses having 0.25 inch diameter formed of silicone tubing about 20 inches long are able to withstand the high temperature exhaust. Manifold 58 is about 3 inches long and has an internal diameter of about 3 inches. Manifold 58 allows multiple exhaust apertures in manifold 52 to be connected to air amplifier 60.

In FIG. 3, an air amplifier 60 is connected to amplifier manifold 58. Air amplifier 60 is about 2.5 inches long and about 2 inches outside diameter. Air amplifiers are commercially available devices such as manufactured by Exair corporation, for example. With further reference to FIG. 4, an explanation of the operation of air amplifier 60 is provided. Compressed air 63 flows through an inlet 64 into an annular chamber 66. It is then throttled through a small ring nozzle 68 at high velocity. This primary air stream adheres to the Coanda profile 70, which directs it toward the outlet 72. A low pressure area is created at the entrance center 74 inducing a high volume flow of air into the exhaust air stream. A Magnehelic pressure monitor 76 (FIG. 3) attached by hose 78 to amplifier manifold 58 allows pressure to be monitored. Dwyer Instruments makes a suitable pressure monitor. Exhaust pressure is adjustable by varying the amount of compressed air 63 into air amplifier 60. An exhaust pressure between 1–3 inches of $H_2O$ works well to effectively remove outgassing. The air amplifier is compact and provides independent precision vacuum control. A common manufacturing space vacuum hookup may not be desirable as vacuum could vary depending upon the number of users connected.

With further reference to FIG. 3, air amplifier 60 generates a low pressure at amplifier manifold 58 that is sufficient to obtain flow over lead frame 50, which is at a higher pressure, through exhaust manifold 52. Screens 54 within exhaust manifold 52 add resistance to the exhaust flow and serve to spread the air flow from the apertures in the bottom of exhaust manifold 52 over the width of lead frame 50. Air flow across the screen closest to the bottom of exhaust manifold 52 tends to be centered as it travels towards the apertures. Providing multiple screens expands air flow so that at the top of exhaust manifold 52, air flow is sufficiently the same across the width of lead frame 50. Four screens are illustrated. Maintenance of diffuser 52 is easy by simply removing and cleaning/replacing screens 54.

Turning now to FIG. 5, a conceptual drawing illustrating an inventive optical rapid cure mold compound apparatus and method is shown. As in FIG. 2, the mold compound cure apparatus of FIG. 5 includes a lamp 28 housed in a reflector 30. Power to the lamp is provided by a rheostat 36 that may be computer controlled. Lead frame track 26 holds lead frame 24 under lamp 28. Lead frame 24 contains a semiconductor chip (unillustrated) encapsulated in a mold compound 80. In general the mold compound is a polymer of either the thermoset variety that cannot be remelted or the thermoplastic variety that can be remelted. Examples include epoxy novolac-based molding compounds, polyester, phenolic, and silicone. Typically, the semiconductor chip is encapsulated in mold compound 80 by transfer molding. An additional reflector 30a is provided on the underside of lead frame 24 to direct emissions from lamp 28 that travel through slits in lead frame 24 back towards mold compound 80. Purge air 32 is directed towards lead frame 24 from the top with additional purge air 32a being directed towards lead frame 24 from the bottom. Exhaust 82 is directed through the side between reflector 30 and lead frame track 26.

Still with reference to FIG. 5, it is believed that exposing mold compound 80 to lamp source 28 for less than one hour at a temperature of approximately 200° C. will be sufficient to cure mold compound 80, thus substantially speeding up the curing process as opposed to the prior art oven cure method. Of course, the temperature and time can be adjusted for type and thickness of mold compound 80. In any event, mold compound lamp curing is much quicker than oven curing. Reflectors 30 and 30a help direct emissions from lamp 28 towards mold compound 80. Purge air 32 and 32a in combination with exhaust 82 evacuate harmful outgassing effects and fragments from mold compound 80. The mold compound cure apparatus may be configured as a stand alone piece of back end manufacturing equipment in the assembly line process.

Turning now to FIG. 6, a conceptual drawing showing an alternative embodiment of a optical mold compound cure apparatus is shown. This apparatus has two lamps, 28 and 28a, one on each side of lead frame 24. Such two lamp system will ensure that the mold compound on the underside of the lead frame is sufficiently heated so that it cures properly. An additional exhaust outlet 82a on the underside of lead frame 24 is provided.

Numerous advantages occur in the die attach and the mold compound cure by optical heat cure processes provided herein. Most polymers used for snap cure die attach can be cured in about 1 minute. Warpage due to die attach can be reduced because thermal mismatch between the silicon chip and the lead frame material is minimized. Low energy absorption by the metal lead frame yields a lower lead frame temperature and less oxidation than the heater block snap cure or oven cure. Selective heating is possible. The die surface is clean because of efficient outgassing exhaust removal directly through the lead frame. The backside of the die attach pad of the lead frame is clean due to lack of a hot plate contact. Resistivity of the die attach after lamp cure is much lower than the conventional oven cure and about the same as the heater block cure. The optical rapid cure apparatus for both die attach and mold compound cure is relatively simple, has a small footprint, is easy to operate and maintain, and is easy to implement in an automated integrated circuit packaging process flow.

While the die attach lamp apparatus and process was described with reference to a semiconductor chip being adhered to a metal lead frame, such description is not limiting as the lamp cure process is applicable in bonding a semiconductor die in a ceramic package. As explained above, the lamp process is suitable for all types of chip bonding including eutectic bonding as well as polymer bonding.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of curing a mold compound used to encapsulate a semiconductor device, comprising the steps of:

encapsulating the semiconductor device with a mold compound by transfer molding; and curing the mold compound by exposing the encapsulated semiconductor device to an unfocused near infrared lamp emitting light having a wavelength between 0.8 microns and 2.8 microns wherein the current through the lamp is varied during curing.

* * * * *

UNITED STATES PATENT AND TRADEMARK OFFICE
CERTIFICATE OF CORRECTION

PATENT NO.   : 5,846,476
DATED        : December 8, 1998
INVENTOR(S)  : Ming Hwang et al.

It is certified that error appears in the above-identified patent and that said Letters Patent is hereby corrected as shown below:

Title page,
Item [54], Title, should read -- OPTICAL CURING PROCESS FOR INTEGRATED CIRCUIT PACKAGE ASSEMBLY --.

Signed and Sealed this

Twenty-ninth Day of November, 2005

JON W. DUDAS
*Director of the United States Patent and Trademark Office*